(12) United States Patent
Yu (10) Patent No.: US 11,454,852 B2
(45) Date of Patent: Sep. 27, 2022

(54) ARRAY SUBSTRATE, MANUFACTURING METHOD THEREOF, AND DISPLAY PANEL

(71) Applicant: TCL CHINA STAR OPTOELECTRONICS TECHNOLOGY CO., LTD., Guangdong (CN)

(72) Inventor: Jiajia Yu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 395 days.

(21) Appl. No.: 16/648,417

(22) PCT Filed: Feb. 25, 2020

(86) PCT No.: PCT/CN2020/076528
§ 371 (c)(1),
(2) Date: Mar. 18, 2020

(87) PCT Pub. No.: WO2021/128565
PCT Pub. Date: Jul. 1, 2021

(65) Prior Publication Data
US 2021/0405477 A1 Dec. 30, 2021

(30) Foreign Application Priority Data
Dec. 27, 2019 (CN) .......................... 201911370884.9

(51) Int. Cl.
*G02F 1/1362* (2006.01)
*H01L 27/12* (2006.01)

(52) U.S. Cl.
CPC .. *G02F 1/136227* (2013.01); *G02F 1/136222* (2021.01); *G02F 1/136286* (2013.01); *H01L 27/124* (2013.01); *H01L 27/127* (2013.01)

(58) Field of Classification Search
CPC ......... G02F 1/136227; G02F 1/136222; G02F 1/136286
See application file for complete search history.

(56) References Cited

U.S. PATENT DOCUMENTS

| 2007/0052885 A1 | 3/2007 | Tanaka |
| 2007/0069639 A1 | 3/2007 | Noh et al. |
| 2012/0105778 A1 | 5/2012 | Fujiyoshi |
| 2013/0168648 A1 | 7/2013 | Jeong |
| 2013/0208205 A1 | 8/2013 | Misaki |

(Continued)

FOREIGN PATENT DOCUMENTS

| CN | 1856731 A | 11/2006 |
| CN | 1941400 A | 4/2007 |

(Continued)

*Primary Examiner* — Lucy P Chien (57) ABSTRACT

The present application provides an array substrate, a manufacturing method thereof, and a display panel. The array substrate includes a substrate, a driving circuit layer located on the substrate, and a pixel electrode layer located on the driving circuit layer, wherein the pixel electrode layer is electrically connected to the driving circuit layer through a first via hole; and wherein the pixel electrode layer further includes at least one second via hole located in the first via hole, and the second via hole exposes a part of the driving circuit layer.

15 Claims, 7 Drawing Sheets

(56) References Cited

U.S. PATENT DOCUMENTS

2014/0104523 A1* 4/2014 Jung .................... G02F 1/1343
                                                        349/41
2017/0160588 A1   6/2017 Xu

FOREIGN PATENT DOCUMENTS

| CN | 103053027 A | 4/2013 |
| CN | 203134796 U | 8/2013 |
| CN | 104965358 A | 10/2015 |
| CN | 208384312 U | 1/2019 |
| CN | 110085621 A | 8/2019 |
| GB | 2498058 A | 7/2013 |

* cited by examiner

FIG. 3 forming a driving circuit layer on a substrate; — S10 forming a first insulating layer on the driving circuit layer; — S20 forming a first via hole on the first insulating layer to expose a first portion of the driving circuit layer; — S30 forming a pixel electrode layer on the first insulating layer, so that the pixel electrode layer is electrically connected to the driving circuit layer through the first via hole; and — S40 forming a second via hole in the pixel electrode layer corresponding to the first via hole, to expose a second portion of the pixel electrode layer. — S50

ARRAY SUBSTRATE, MANUFACTURING METHOD THEREOF, AND DISPLAY PANEL

BACKGROUND OF INVENTION

Field of Invention

The present application relates to a field of display, and in particular, to an array substrate, a manufacturing method thereof, and a display panel.

Description of Prior Art

The existing display panel generally includes a driving circuit layer for driving the panel to emit light. For example, each of a liquid crystal display panel and an organic light-emitting display panel includes an array substrate that drives the panel to emit light. The array substrate is generally provided with a pixel electrode layer that makes the panel emit light, and the pixel electrode layer is electrically connected to the driving circuit layer through an electrical connection via hole, so that the driving circuit layer provides a driving voltage to the pixel electrode layer.

In the current via hole process, the above-mentioned electrical connection via hole is usually formed on the array substrate by dry etching with a fluorine-containing gas. After etching, there are still some fluorine-containing compounds in the via hole. In the subsequent process, the fluorine-containing compounds will volatilize and cause bubbles to form on the pixel electrode layer, which will cause abnormal contact between the pixel electrode layer and the source/drains, impacting the quality of the product.

Therefore, there is an urgent need to develop an array substrate to solve the above technical problems.

SUMMARY OF INVENTION

The present application provides an array substrate, a manufacturing method thereof, and a display panel to solve a technical problem of bubbles appearing on the existing pixel electrode layer.

The present application proposes an array substrate including a substrate, a driving circuit layer located on the substrate, and a pixel electrode layer located on the driving circuit layer, wherein the pixel electrode layer is electrically connected to the driving circuit layer through a first via hole; and wherein the pixel electrode layer further includes at least one second via hole located in the first via hole, and the second via hole exposes a part of the driving circuit layer.

In the array substrate of the present application, the driving circuit layer includes a gate layer and a source/drain layer;

the gate layer includes a plurality of scan lines and a gate, and the source/drain layer includes a source/drain and a plurality of data lines disposed perpendicular to the scan lines;

the array substrate further includes a first insulating layer located between the source/drain layer and the pixel electrode layer, and the first via hole is located on the first insulating layer; and the pixel electrode layer is electrically connected to the source/drain through the first via hole.

In the array substrate of the present application, the array substrate includes a plurality of driving areas divided by the plurality of the scan lines and the plurality of the data lines;

each of the driving areas includes a pixel light-emitting area and a pixel non-light-emitting area; and the second via hole is located in the pixel non-light-emitting area.

In the array substrate of the present application, the pixel electrode layer includes a first pixel area located in the pixel light-emitting area and a second pixel area located in the pixel non-light-emitting area, and a pixel electrode in the first pixel area is electrically connected to the driving circuit layer through a pixel electrode in the second pixel area;

the first pixel area is provided with a first trunk electrode, a second trunk electrode disposed perpendicular to the first trunk electrode, and a plurality of branch electrodes electrically connected to the first trunk electrode or the second trunk electrode; and the first trunk electrode or/and the second trunk electrode are further provided with a plurality of third via holes, and a diameter of each of the third via holes is equal to that of the second via hole.

In the array substrate of the present application, the array substrate further includes a plurality of fourth via holes close to the first via hole; and the fourth via holes penetrate the pixel electrode layer and the first insulating layer, and expose part of the source/drain.

In the array substrate of the present application, the pixel electrode layer is made of a material including indium tin oxide.

The present application also proposes a method of manufacturing an array substrate, which includes:

forming a driving circuit layer on a substrate;

forming a first insulating layer on the driving circuit layer;

forming a first via hole on the first insulating layer to expose a first portion of the driving circuit layer;

forming a pixel electrode layer on the first insulating layer, so that the pixel electrode layer is electrically connected to the driving circuit layer through the first via hole; and forming a second via hole in the pixel electrode layer corresponding to the first via hole, to expose a second portion of the pixel electrode layer.

In the method of manufacturing the array substrate of the present application, the step of forming the driving circuit layer on the substrate includes:

forming a gate layer on the substrate; and forming a source/drain layer on the gate layer; or alternatively, forming a source/drain layer on the substrate; and forming a gate layer on the source/drain layer;

wherein, the gate layer includes a plurality of scan lines and a gate, and the source/drain layer includes a source/drain and a plurality of data lines disposed perpendicular to the scan line;

the array substrate further includes the first insulating layer located between the source/drain layer and the pixel electrode layer, and the first via hole is located on the first insulating layer; and the pixel electrode layer is electrically connected to a source/drain through the first via hole.

In the method of manufacturing the array substrate of the present application, the array substrate includes a plurality of driving areas divided by the plurality of the scan lines and the plurality of the data lines;

each of the driving areas includes a pixel light-emitting area and a pixel non-light-emitting area; and the second via hole is located in the pixel non-light-emitting area.

In the method of manufacturing the array substrate of the present application, the step of forming the pixel electrode layer on the first insulating layer includes:

forming a pixel electrode film on the first insulating layer;

subjecting the pixel electrode film to a first patterning process to form a pixel electrode layer including a first pixel area located in the pixel light-emitting area and a second pixel area located in the pixel non-light-emitting area; and forming a plurality of third via holes on a pixel electrode in the first pixel area;

wherein the first pixel area is provided with a first trunk electrode, a second trunk electrode disposed perpendicular to the first trunk electrode, and a plurality of branch electrodes electrically connected to the first trunk electrode or the second trunk electrode, and the plurality of the third via holes are located on the first trunk electrode or/and the second trunk electrode.

In the method of manufacturing the array substrate of the present application, the array substrate further includes:

forming a plurality of fourth via holes in an area close to the first via hole;

wherein the fourth via holes penetrate the pixel electrode layer and the first insulating layer, and expose part of the source/drain.

In the method of manufacturing the array substrate of the present application, the pixel electrode layer is made of a material including indium tin oxide.

The present application also proposes a display panel. The display panel includes an array substrate, a color filter substrate disposed opposite to the array substrate, and a liquid crystal layer located between the array substrate and the color filter substrate, wherein the array substrate includes:

a substrate, a driving circuit layer located on the substrate, and a pixel electrode layer located on the driving circuit layer, wherein the pixel electrode layer is electrically connected to the driving circuit layer through a first via hole; and wherein the pixel electrode layer further includes at least one second via hole located in the first via hole, and the second via hole exposes a part of the driving circuit layer.

In the display panel of the present application, the driving circuit layer includes a gate layer and a source/drain layer;

the gate layer includes a plurality of scan lines and a gate, and the source/drain layer includes a source/drain and a plurality of data lines disposed perpendicular to the scan line;

the array substrate further includes a first insulating layer located between the source/drain layer and the pixel electrode layer, and the first via hole is located on the first insulating layer; and the pixel electrode layer is electrically connected to the source/drain through the first via hole.

In the display panel of the present application, the array substrate includes a plurality of driving areas divided by the plurality of the scan lines and the plurality of the data lines;

each of the driving areas includes a pixel light-emitting area and a pixel non-light-emitting area; and the second via hole is located in the pixel non-light-emitting area.

In the display panel of the present application, the pixel electrode layer includes a first pixel area located in the pixel light-emitting area and a second pixel area located in the pixel non-light-emitting area, and a pixel electrode in the first pixel area is electrically connected to the driving circuit layer through a pixel electrode in the second pixel area;

the first pixel area is provided with a first trunk electrode, a second trunk electrode disposed perpendicular to the first trunk electrode, and a plurality of branch electrodes electrically connected to the first trunk electrode or the second trunk electrode; and the first trunk electrode or/and the second trunk electrode are further provided with a plurality of third via holes, and a diameter of each of the third via holes is equal to that of the second via hole.

In the display panel of the present application, the array substrate further includes a plurality of fourth via holes close to the first via hole; and the fourth via holes penetrate the pixel electrode layer and the first insulating layer, and exposes part of the source/drain.

In the display panel of the present application, the pixel electrode layer is made of a material including indium tin oxide.

In the present application, by forming at least one second via hole in a first via hole, a fluorine-containing gas remaining in the first via hole escapes from the second via hole, such that a technical problem of occurrence of bubbles in the pixel electrode layer is avoided, and thus the contact between the pixel electrode layer and the source/drain is improved.

DETAILED DESCRIPTION OF PREFERRED EMBODIMENTS

In order to make the purpose, technical solution, and effect of the present application clearer and more definite, the present application is further described in detail below with reference to the accompanying drawings and examples. It should be understood that the specific embodiments described herein are only used to explain the present application, and are not used to limit the present application.

In the current via hole process, the above-mentioned electrical connection via hole is usually formed on the array substrate by dry etching with a fluorine-containing gas. After etching, there are still some fluorine-containing compounds in the via hole. In the subsequent process, the fluorine-containing compounds will volatilize and cause bubbles to form on the pixel electrode layer, which will cause abnormal contact between the pixel electrode layer and the source/drains, impacting the quality of the product. The present application proposes an array substrate and a manufacturing method thereof as technical solutions in view of the above technical problems.

Figure 1:
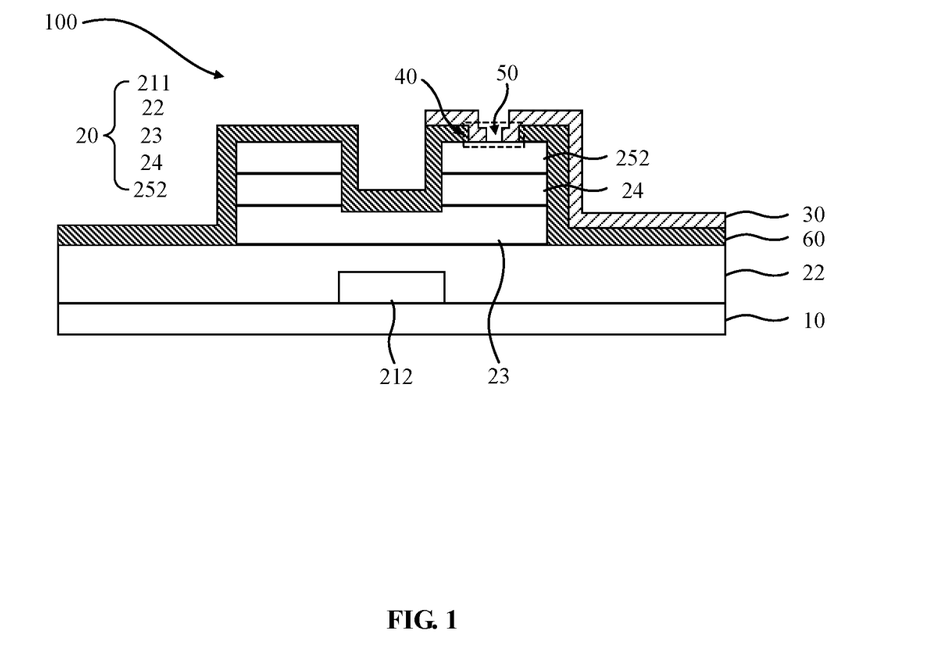
FIG. 1 is a first structural diagram of an array substrate according to the present application.
Figure 2:
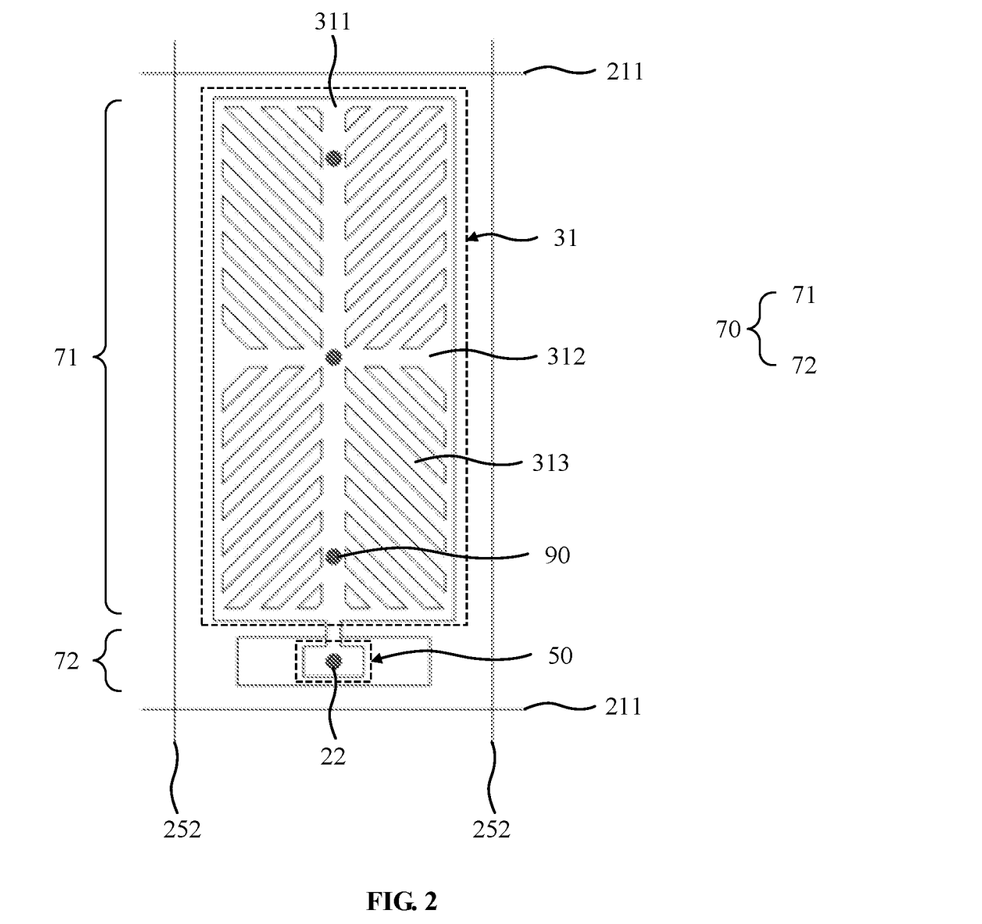
FIG. 2 is a top structural view of an array substrate according to the present application.
Figure 3:
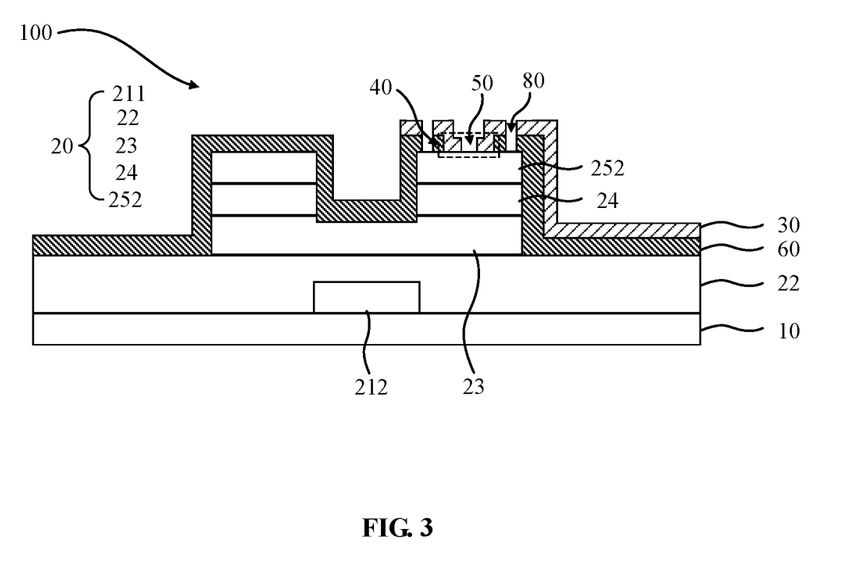
FIG. 3 is a second structural diagram of an array substrate according to the present application.

Referring to FIG. 1 to FIG. 3, the array substrate 100 includes a substrate 10, a driving circuit layer 20 on the substrate 10, and a pixel electrode layer 30 on the driving circuit layer 20. The pixel electrode layer 30 is electrically connected to the driving circuit layer 20 through the first via hole 40.

In this embodiment, the pixel electrode layer 30 further includes at least one second via hole 50 located in the first via hole 40, and the second via hole 50 exposes a part of the driving circuit layer 20.

In the present application, by forming at least one second via hole 50 in a first via hole 40, a fluorine-containing gas remaining in the first via hole 40 escapes from the second via hole 50, such that a technical problem of occurrence of bubbles in the pixel electrode layer 30 is avoided, and thus the contact between the pixel electrode layer 30 and the source/drain 252 is improved.

The technical solution of the present application will be described below according to specific embodiments.

Referring to FIG. 1, the substrate 10 may be one of a glass substrate, a quartz substrate, and a resin substrate. Alternatively, the substrate 10 may be made of a flexible material, such as polyimide (PI).

The driving circuit layer 20 is located on the substrate 10. The driving circuit layer 20 includes a plurality of thin film transistors, and the thin film transistors may be of an etch stop type, a back channel etch type, a bottom gate thin film transistor type, or a top gate thin film transistor type, and not specifically limited herein. The description given below takes the thin film transistors of a back channel etch type as an example.

In this embodiment, the driving circuit layer 20 includes a gate layer 21 on the substrate 10, a gate insulating layer 22 on the gate layer 21, a semiconductor layer 23 on the gate insulating layer 22, an ohmic barrier layer 24 on the semiconductor layer 23, and a source/drain layer 25 on the ohmic barrier layer 24.

Materials and forming processes of the gate layer 21, the gate insulating layer 22, the semiconductor layer 23, the ohmic barrier layer 24, and the source/drain layer 25 in this embodiment are all prior art, and will not be described in detail herein for brevity.

In this embodiment, the gate layer 21 includes a plurality of scan lines 211 and a gate 212. The source/drain layer 25 includes a source/drain 252 and a plurality of data lines 251 disposed perpendicular to the scan lines 211. The plurality of the data lines 251 horizontally and vertically intersect the plurality of the scan lines 211 to form a plurality of driving areas 70. The driving areas 70 correspond to pixel units one-by-one.

Referring to FIG. 1, the array substrate 100 further includes a first insulating layer 60 between the source/drain layer 25 and the pixel electrode. The first insulating layer 60 may be made of an inorganic material such as silicon nitride, silicon carbide, or the like.

In this embodiment, the first via hole 40 may be located on the first insulating layer 60, and the first via hole 40 exposes a first portion of the source/drain 252.

The pixel electrode layer 30 is located on the first insulating layer 60, and the pixel electrode layer 30 is electrically connected to the first portion of the source/drain 252 through the first via hole 40.

In this embodiment, the pixel electrode layer 30 may be made of a material including indium tin oxide (ITO).

Referring to FIG. 1, the array substrate 100 further includes a second via hole 50 located on the pixel electrode layer 30. The second via hole 50 penetrates the pixel electrode layer 30 and exposes a second portion of the source/drain 252. The first portion of the source/drain 252 corresponds to the first via hole 40, and the second portion of the source/drain 252 corresponds to the second via hole 50.

In this embodiment, the second via hole 50 is located in the first via hole 40.

In this embodiment, a plurality of the second via holes 50 may be disposed in the first via hole 40, and the second via holes 50 are evenly distributed in the first via hole 40.

In this embodiment, an orthographic projection of the second portion of the source/drain 252 on the substrate 10 is located within an orthographic projection of the first portion of the source/drain 252 on the substrate 10.

In the present application, by forming at least one second via hole 50 in a first via hole 40, a fluorine-containing gas remaining in the first via hole 40 escapes from the second via hole 50, such that a technical problem of occurrence of bubbles in the pixel electrode layer 30 is avoided, and thus the contact between the pixel electrode layer 30 and the source/drain 252 is improved.

Referring to FIG. 2, the array substrate 100 includes a plurality of driving areas 70 divided by a plurality of the scan lines 211 and a plurality of the data lines 251. Each of the driving areas 70 includes a pixel light-emitting area 71 and a pixel non-light-emitting area 72.

In this embodiment, the second via hole 50 may be located in the pixel non-light-emitting area 72.

The pixel electrode layer 30 includes a first pixel area 31 located in the pixel light-emitting area 71 and a second pixel area 32 located in the pixel non-light-emitting area 72. The pixel electrode in the first pixel area 31 is electrically connected to the driving circuit layer 20 through a pixel electrode in the second pixel area 32.

The first pixel area 31 is provided with a first trunk electrode 311, a second trunk electrode 312 disposed perpendicular to the first trunk electrode 311, and a plurality of branch electrodes 313 electrically connected to the first trunk electrode 311 or the second trunk electrode 312.

The first trunk electrode 311 or/and the second trunk electrode 312 are further provided with a plurality of third via holes 90, and a diameter of each of the third via holes 90 is equal to or different from that of the second via hole 50.

For a liquid crystal display panel, due to the presence of the horizontally and vertically staggered trunk electrodes, dark streaks are present in the area corresponding to the horizontally and vertically staggered trunk electrodes. In addition, since the areas corresponding to the trunk electrodes are generally made of an inorganic material, a certain amount of bubbles may also exist in the areas. Therefore, in the present application, at least one third via hole 90 is provided on the horizontally and vertically staggered trunk electrodes to release bubbles generated in an area corresponding to the third via hole 90, thereby preventing the first pixel area 31 from occurrence of bubbles which results in reduction of flatness of the pixel electrode and impacts the alignment of the liquid crystal layer subsequentially.

Referring to FIG. 3, the array substrate 100 further includes a plurality of fourth via holes 80 disposed near the first via holes 40.

In this embodiment, the fourth via holes 80 penetrate the pixel electrode layer 30 and the first insulating layer 60, and expose a third portion of the source/drain 252.

Based on FIG. 1, this embodiment adds the fourth via holes 80 to the periphery of the first via hole 40 to provide another channel for escaping of the fluorine-containing compound, such that a technical problem of occurrence of bubbles in the pixel electrode layer 30 is avoided, and thus the contact between the pixel electrode layer 30 and the source/drain 252 is improved.

Figure 4:
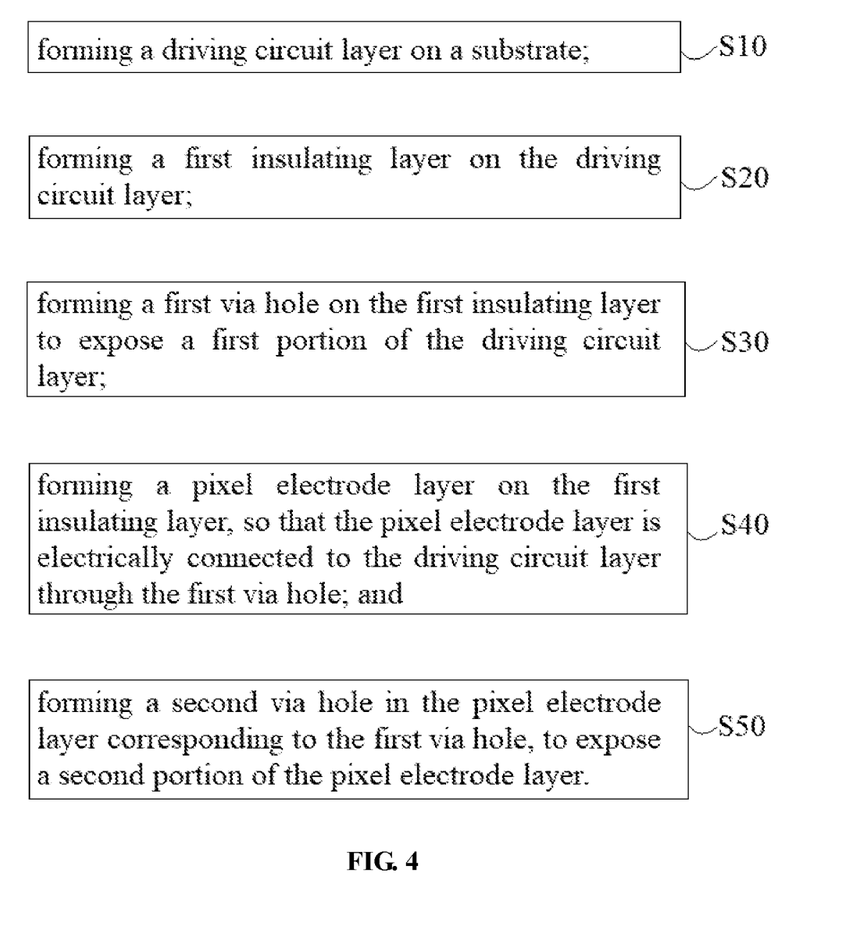
FIG. 4 is a step flow chart of a method of manufacturing an array substrate according to the present application.

Referring to FIG. 4, the present application further provides a method of manufacturing the array substrate 100, which includes:

S10. forming a driving circuit layer 20 on a substrate 10.

Figure 5A:
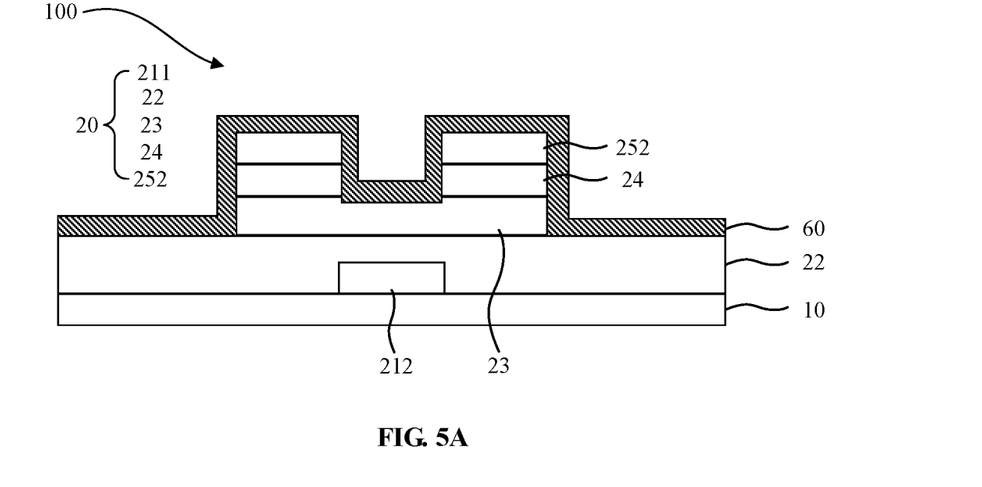
FIG. 5A to FIG. 5E are process flow diagrams of a method of manufacturing an array substrate according to the present application.

Referring to FIG. 5A, the driving circuit layer 20 includes a plurality of thin film transistors, and the thin film transistors may be of an etch stop type, a back channel etch type, a bottom gate thin film transistor type, or a top gate thin film transistor type, and not specifically limited herein.

For example, when the thin film transistors of a back channel etch type are taken as an example for description, the step of forming the driving circuit layer 20 on the substrate 10 may specifically include:

S101. forming a gate layer 21 on the substrate 10; and

S102. forming a source/drain layer 25 on the gate layer 21.

Alternatively, when the thin film transistors of a top gate type are taken as an example for description, the step of forming the driving circuit layer 20 on the substrate 10 may specifically include:

S111. forming a source/drain layer 25 on the substrate 10; and

S112. forming a gate layer 21 on the source/drain layer 25.

In the following structure, the present application takes the thin film transistors of a back channel etch type as an example for description.

Between steps S101 and S102, step S10 further includes:

forming a gate insulating layer 22 on the gate layer 21;

forming a semiconductor layer 23 on the gate insulating layer 22; and forming an ohmic barrier layer 24 between the semiconductor layer 23 and the source/drain layer 25.

In this embodiment, the substrate 10 may be one of a glass substrate, a quartz substrate, and a resin substrate. Alternatively, the substrate 10 may be made of a flexible material, such as polyimide (PI).

Materials and forming processes of the gate layer 21, the gate insulating layer 22, the semiconductor layer 23, the ohmic barrier layer 24, and the source/drain layer 25 in this embodiment are all prior art, and will not be described in detail herein for brevity.

In this embodiment, the gate layer 21 includes a plurality of scan lines 211 and a gate 212. The source/drain layer 25 includes a source/drain 252 and a plurality of data lines 251 disposed perpendicular to the scan lines 211. The plurality of the data lines 251 horizontally and vertically intersect the plurality of the scan lines 211 to form a plurality of driving areas 70. The driving areas 70 correspond to pixel units one-by-one.

In this embodiment, the driving area 70 may include a pixel light-emitting area 71 and a pixel non-light-emitting area 72.

Figure 5B:
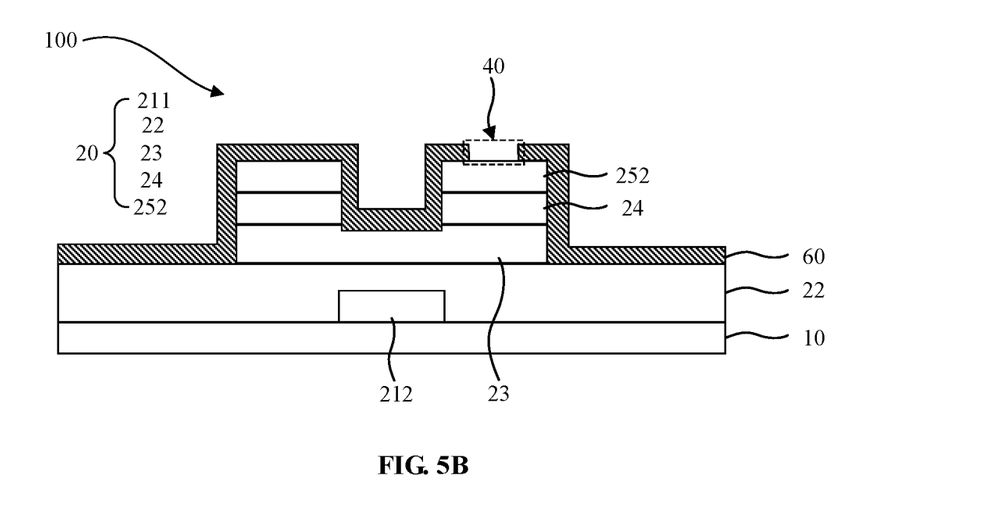

S20. forming a first insulating layer 60 on the driving circuit layer 20.

Referring to FIG. 5B, the first insulating layer 60 is located between the source/drain layer 25 and the pixel electrode. The first insulating layer 60 may be made of an inorganic material, such as silicon nitride or silicon carbide.

S30. forming a first via hole 40 on the first insulating layer 60 to expose a first portion of the driving circuit layer 20.

Referring to FIG. 5B, the first via hole 40 may be formed by an etching process. In this embodiment, the first via hole 40 is formed by dry etching with a fluorine-containing gas.

Figure 5C:
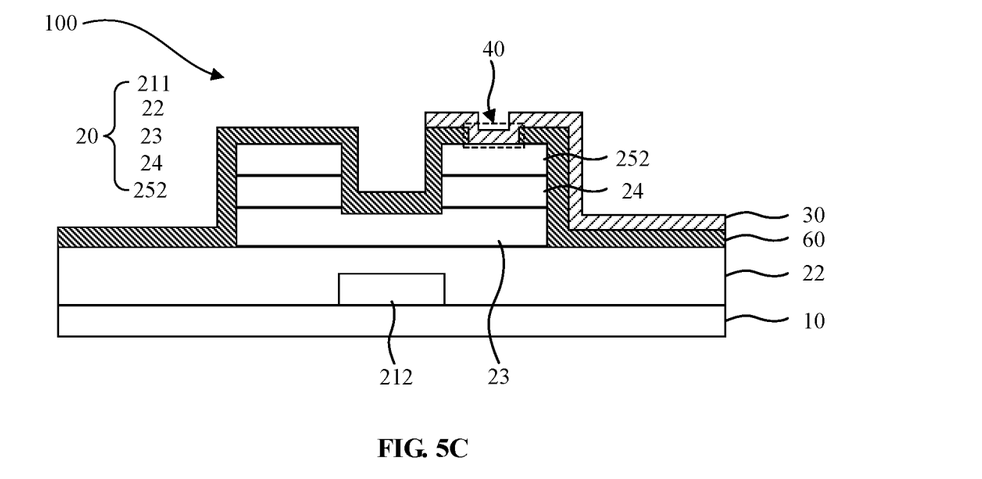

S40. forming a pixel electrode layer 30 on the first insulating layer 60, so that the pixel electrode layer 30 is electrically connected to the driving circuit layer 20 through the first via hole 40.

Referring to FIG. 5C and FIG. 2, the step S40 specifically includes:

S401. forming a pixel electrode film on the first insulating layer 60; and

S402. subjecting the pixel electrode film to a first patterning process to form a pixel electrode layer 30 including a first pixel area 31 located in the pixel light-emitting area 71 and a second pixel area 32 located in the pixel non-light emitting area 72.

In this embodiment, the pixel electrode layer 30 may be made of a material including indium tin oxide (ITO).

Figure 5D:
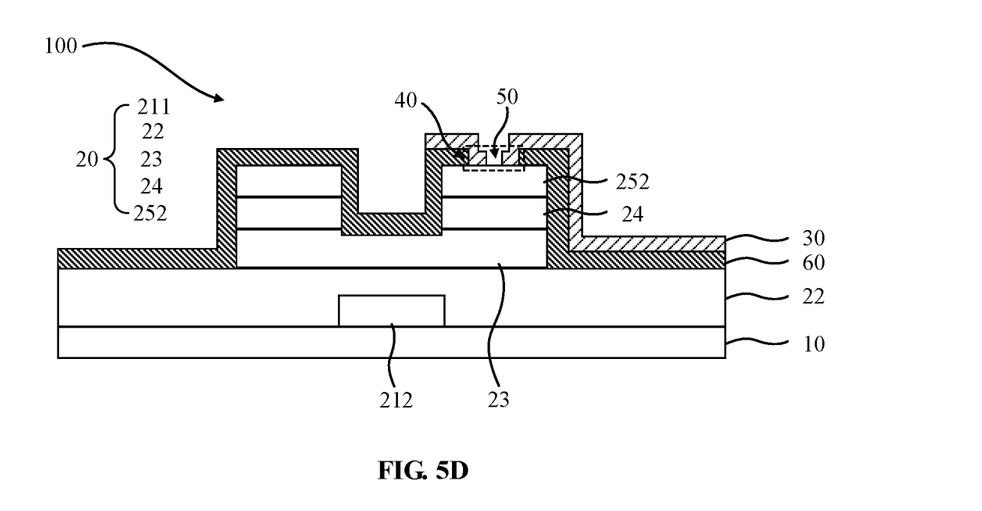

S50. forming a second via hole 50 in an area corresponding to the first via hole 40 in the pixel electrode layer 30 to expose a second portion of the pixel electrode layer 30.

Referring to FIG. 5D, the second via hole 50 penetrates the pixel electrode layer 30 and exposes a second portion of the source/drain 252. The first portion of the source/drain 252 corresponds to the first via hole 40, and the second portion of the source/drain 252 corresponds to the second via hole 50.

In this embodiment, the second via hole 50 is located in the first via hole 40.

In this embodiment, a plurality of the second via holes 50 may be disposed in the first via hole 40, and the second via holes 50 are evenly distributed in the first via hole 40.

In this embodiment, an orthographic projection of the second portion of the source/drain 252 on the substrate 10 is located within an orthographic projection of the first portion of the source/drain 252 on the substrate 10.

In the present application, by forming at least one second via hole 50 in a first via hole 40, when a fluorine-containing gas remaining in the first via hole 40 is volatilized by heat, it escapes from the second via hole 50, such that a technical problem of occurrence of bubbles in the pixel electrode layer 30 is avoided, and thus the contact between the pixel electrode layer 30 and the source/drain 252 is improved.

Referring to FIG. 2, the step S40 may further include:

S403. forming a plurality of third via holes 90 on the pixel electrode in the first pixel area 31.

In this embodiment, the first pixel area 31 is provided with a first trunk electrode 311, a second trunk electrode 312 disposed perpendicular to the first trunk electrode 311, and a plurality of branch electrodes 313 electrically connected to the first trunk electrode 311 or the second trunk electrode 312. The first trunk electrode 311 or/and the second trunk electrode 312 are further provided with a plurality of third via holes 90.

In this embodiment, a diameter of each of the third via holes 90 is equal to or different from that of the second via hole 50.

For a liquid crystal display panel, due to the presence of the horizontally and vertically staggered trunk electrodes, dark streaks are present in the area corresponding to the horizontally and vertically staggered trunk electrodes. In addition, since the areas corresponding to the trunk electrodes are generally made of an inorganic material, a certain amount of bubbles may also exist in the areas. Therefore, in the present application, at least one third via hole 90 is provided on the horizontally and vertically staggered trunk electrodes to release bubbles generated in an area corresponding to the third via hole 90, thereby preventing the first pixel area 31 from occurrence of bubbles results in reduction of flatness of the pixel electrode and impacts the alignment of the liquid crystal layer subsequentially.

Figure 5E:
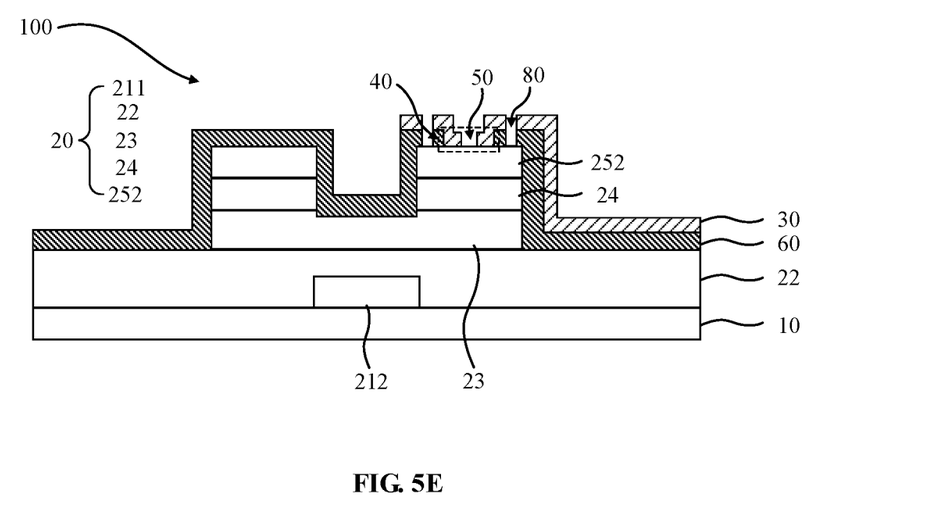

Referring to FIG. 5E, the method of manufacturing the array substrate 100 further includes:

S60. forming a plurality of fourth via holes 80 in an area close to the first via hole 40.

In this embodiment, the fourth via holes 80 penetrate the pixel electrode layer 30 and the first insulating layer 60, and the fourth via holes 80 expose part of the source/drain 252.

Based on FIG. 5D, in this step, the fourth via hole 80 is added to the periphery of the first via hole 40, which provides another channel or escaping of the fluorine-containing compound, such that a technical problem of occurrence of bubbles in the pixel electrode layer 30 is avoided, and thus the contact between the pixel electrode layer 30 and the source/drain 252 is improved.

The present application also proposes a display panel including the above-mentioned array substrate, a color filter substrate disposed opposite to the array substrate, and a liquid crystal layer located between the array substrate and the color filter substrate. The working principle of the display panel is the same as or similar to the working principle of the above-mentioned array substrate, and is not repeated herein for brevity.

The present application proposes an array substrate, a manufacturing method thereof, and a display panel. The array substrate includes a substrate, a driving circuit layer located on the substrate, and a pixel electrode layer located on the driving circuit layer, wherein the pixel electrode layer is electrically connected to the driving circuit layer through a first via hole; and wherein the pixel electrode layer further includes at least one second via hole located in the first via hole, and the second via hole exposes a part of the driving circuit layer. In the present application, by forming at least one second via hole in a first via hole, a fluorine-containing gas remaining in the first via hole escapes from the second via hole, such that a technical problem of occurrence of bubbles in the pixel electrode layer is avoided, and thus the contact between the pixel electrode layer and the source/drain is improved.

It can be understood that for a person of ordinary skill in the art, equivalent replacements or variations can be made according to the technical solution of the present application and its inventive concept, and all these variations or replacements should fall within the protection scope of the claims of the present application.

What is claimed is:

1. An array substrate, comprising a substrate, a driving circuit layer located on the substrate, and a pixel electrode layer located on the driving circuit layer, wherein the pixel electrode layer is electrically connected to the driving circuit layer through a first via hole;
   wherein the pixel electrode layer further comprises at least one second via hole located in the first via hole, and the second via hole exposes a part of the driving circuit layer;
   wherein the driving circuit layer comprises a gate layer and a source/drain layer, the gate layer comprises a plurality of scan lines and a gate, and the source/drain layer comprises a source/drain and a plurality of data lines disposed perpendicular to the scan lines; and
   wherein the array substrate further comprises a plurality of volatilization via holes close to the first via hole, the volatilization via holes penetrate the pixel electrode layer and the first insulating layer, and expose part of the source/drain.

2. The array substrate according to claim 1, wherein
   the array substrate further comprises a first insulating layer located between the source/drain layer and the pixel electrode layer, and the first via hole is located on the first insulating layer; and
   the pixel electrode layer is electrically connected to the source/drain through the first via hole.

3. The array substrate according to claim 2, wherein the array substrate comprises a plurality of driving areas divided by the plurality of the scan lines and the plurality of the data lines;
   each of the driving areas comprises a pixel light-emitting area and a pixel non-light-emitting area; and
   the second via hole is located in the pixel non-light-emitting area.

4. The array substrate according to claim 3, wherein
   the pixel electrode layer comprises a first pixel area located in the pixel light-emitting area and a second pixel area located in the pixel non-light emitting area, and a pixel electrode in the first pixel area is electrically connected to the driving circuit layer through a pixel electrode in the second pixel area;
   the first pixel area is provided with a first trunk electrode, a second trunk electrode disposed perpendicular to the first trunk electrode, and a plurality of branch electrodes electrically connected to the first trunk electrode or the second trunk electrode; and
   the first trunk electrode or/and the second trunk electrode are further provided with a plurality of third via holes, and a diameter of each of the third via holes is equal to that of the second via hole.

5. The array substrate according to claim 1, wherein the pixel electrode layer is made of a material comprising indium tin oxide.

6. A method of manufacturing an array substrate, comprising:
   forming a driving circuit layer on a substrate;
   forming a first insulating layer on the driving circuit layer;
   forming a first via hole on the first insulating layer to expose a first portion of the driving circuit layer;
   forming a pixel electrode layer on the first insulating layer, so that the pixel electrode layer is electrically connected to the driving circuit layer through the first via hole; and
   forming a second via hole in the pixel electrode layer corresponding to the first via hole, to expose a second portion of the pixel electrode layer;
   wherein the driving circuit layer comprises a gate layer and a source/drain layer, the gate layer comprises a plurality of scan lines and a gate, and the source/drain layer comprises a source/drain and a plurality of data lines disposed perpendicular to the scan lines; and
   wherein the array substrate further comprises a plurality of volatilization via holes close to the first via hole, the volatilization via holes penetrate the pixel electrode layer and the first insulating layer, and expose part of the source/drain.

7. The method of manufacturing the array substrate according to claim 6, wherein the step of forming the driving circuit layer on the substrate comprises:
   forming the gate layer on the substrate; and
   forming the source/drain layer on the gate layer; or alternatively,
   forming the source/drain layer on the substrate; and
   forming the gate layer on the source/drain layer; wherein the array substrate further comprises the first insulating layer located between the source/drain layer and the pixel electrode layer, and the first via hole is located on the first insulating layer; and the pixel electrode layer is electrically connected to a source/drain through the first via hole.

8. The method of manufacturing the array substrate according to claim 7, wherein the array substrate comprises a plurality of driving areas divided by the plurality of the scan lines and the plurality of the data lines;

each of the driving areas comprises a pixel light-emitting area and a pixel non-light-emitting area; and the second via hole is located in the pixel non-light emitting area.

9. The method of manufacturing the array substrate according to claim 8, wherein the step of forming the pixel electrode layer on the first insulating layer comprises:

forming a pixel electrode film on the first insulating layer;

subjecting the pixel electrode film to a first patterning process to form a pixel electrode layer comprising a first pixel area located in the pixel light-emitting area and a second pixel area located in the pixel non-light emitting area; and forming a plurality of third via holes on a pixel electrode in the first pixel area;

wherein the first pixel area is provided with a first trunk electrode, a second trunk electrode disposed perpendicular to the first trunk electrode, and a plurality of branch electrodes electrically connected to the first trunk electrode or the second trunk electrode, and the plurality of the third via holes are located on the first trunk electrode or/and the second trunk electrode.

10. The method of manufacturing the array substrate according to claim 6, wherein:

the pixel electrode layer is made of a material comprising indium tin oxide.

11. A display panel, comprising an array substrate, a color filter substrate disposed opposite to the array substrate, and a liquid crystal layer located between the array substrate and the color filter substrate, wherein the array substrate comprises:

a substrate, a driving circuit layer located on the substrate, and a pixel electrode layer located on the driving circuit layer, wherein the pixel electrode layer is electrically connected to the driving circuit layer through a first via hole; and wherein the pixel electrode layer further comprises at least one second via hole located in the first via hole, and the second via hole exposes a part of the driving circuit layer;

wherein the driving circuit layer comprises a gate layer and a source/drain layer, the gate layer comprises a plurality of scan lines and a gate, and the source/drain layer comprises a source/drain and a plurality of data lines disposed perpendicular to the scan lines; and wherein the array substrate further comprises a plurality of volatilization via holes close to the first via hole, the volatilization via holes penetrate the pixel electrode layer and the first insulating layer, and expose part of the source/drain.

12. The display panel according to claim 11, wherein the array substrate further comprises a first insulating layer located between the source/drain layer and the pixel electrode layer, and the first via hole is located on the first insulating layer; and the pixel electrode layer is electrically connected to the source/drain through the first via hole.

13. The display panel according to claim 12, wherein the array substrate comprises a plurality of driving areas divided by the plurality of the scan lines and the plurality of the data lines;

each of the driving areas comprises a pixel light-emitting area and a pixel non-light-emitting area; and the second via hole is located in the pixel non-light-emitting area.

14. The display panel according to claim 13, wherein the pixel electrode layer comprises a first pixel area located in the pixel light-emitting area and a second pixel area located in the pixel non-light-emitting area, and a pixel electrode in the first pixel area is electrically connected to the driving circuit layer through a pixel electrode in the second pixel area;

the first pixel area is provided with a first trunk electrode, a second trunk electrode disposed perpendicular to the first trunk electrode, and a plurality of branch electrodes electrically connected to the first trunk electrode or the second trunk electrode; and the first trunk electrode or/and the second trunk electrode are further provided with a plurality of third via holes, and a diameter of each of the third via holes is equal to that of the second via hole.

15. The display panel according to claim 11, wherein the pixel electrode layer is made of a material comprising indium tin oxide.

* * * * *